(12) United States Patent
Tseng et al.

(10) Patent No.: US 9,892,982 B2
(45) Date of Patent: Feb. 13, 2018

(54) METHOD FOR CONTROLLING EXHAUST FLOW IN WAFER PROCESSING MODULE

(71) Applicant: Taiwan Semiconductor Manufacturing Co., Ltd., Hsin-Chu (TW)

(72) Inventors: Kuo-Shu Tseng, New Taipei (TW); Chien-Hua Chen, Taichung (TW); You-Feng Chen, Taichung (TW); Yen-Yu Chen, Taichung (TW); Zhong-Yi Chen, Tainan (TW); Yung-Haw Liaw, Hsin-Chu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 22 days.

(21) Appl. No.: 14/146,996

(22) Filed: Jan. 3, 2014

(65) Prior Publication Data

US 2015/0191816 A1 Jul. 9, 2015

(51) Int. Cl.
*H01L 21/027* (2006.01)
*H01L 21/66* (2006.01)
*H01L 21/67* (2006.01)

(52) U.S. Cl.
CPC .......... *H01L 22/26* (2013.01); *H01L 21/0276* (2013.01); *H01L 21/67017* (2013.01); *H01L 21/67253* (2013.01)

(58) Field of Classification Search
CPC ............... C23C 14/54–14/544; H01L 21/0276
See application file for complete search history.

(56) References Cited

U.S. PATENT DOCUMENTS

| | | | |
|---|---|---|---|
| 6,711,956 B2* | 3/2004 | Lin | G05D 16/2013 137/487.5 |
| 7,026,580 B2* | 4/2006 | Kao | F27B 17/0025 118/50.1 |
| 7,351,936 B1* | 4/2008 | Chang | F27B 17/0025 118/724 |
| 2003/0037801 A1* | 2/2003 | Bailey | B08B 7/00 134/1 |
| 2005/0251276 A1* | 11/2005 | Shen | G05B 23/024 700/108 |
| 2007/0190474 A1* | 8/2007 | Su | F27D 19/00 432/37 |
| 2015/0129044 A1* | 5/2015 | Chou | H01L 21/67253 137/14 |

* cited by examiner

*Primary Examiner* — Elizabeth A Burkhart
(74) *Attorney, Agent, or Firm* — McClure, Qualey & Rodack, LLP (57) ABSTRACT

Embodiments of mechanisms for processing a wafer are provided. A method for processing a wafer includes placing the wafer into a processing assembly and heating the wafer. The method also includes producing an exhaust flow from the processing assembly via a fluid-conduit assembly. The method further includes detecting an exhaust pressure of the exhaust flow in the fluid-conduit assembly and producing a first signal and a second signal corresponding to the exhaust pressure. In addition, the method includes regulating the exhaust flow in response to the first signal and controlling the processing assembly in response to the second signal.

13 Claims, 6 Drawing Sheets

METHOD FOR CONTROLLING EXHAUST FLOW IN WAFER PROCESSING MODULE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the processes include coating a photoresist on the semiconductor wafer followed by a soft bake process. When the soft bake process is performed, the chemical properties of the photoresist struck by radiation change in a manner that depends on the type of resist used.

Although existing methods and devices for operating the processing steps have been generally adequate for their intended purposes, they have not been entirely satisfactory in all respects. Consequently, it would be desirable to provide a solution for the process control for semiconductor manufacturing operations

BRIEF DESCRIPTION OF THE DRAWINGS

For a more complete understanding of the embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
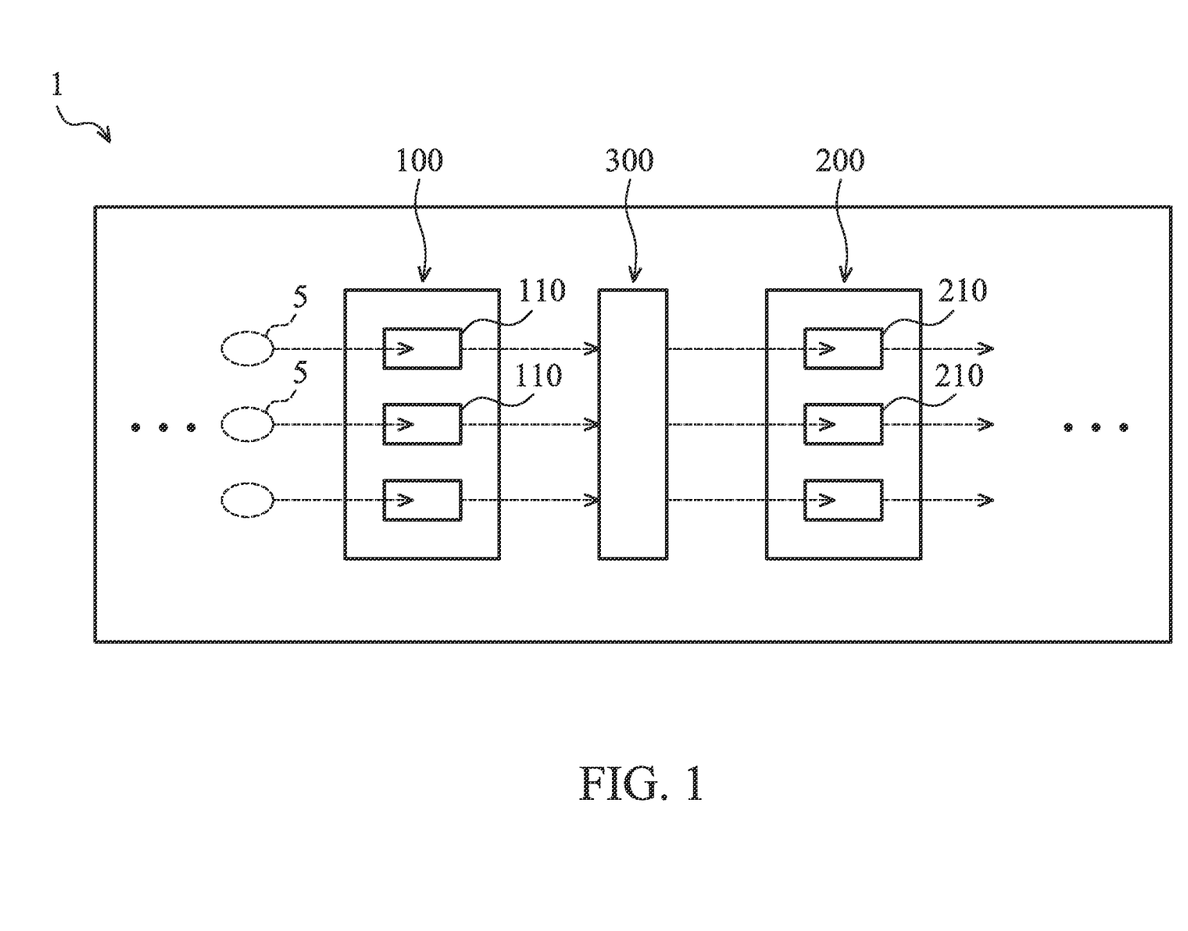
FIG. 1 shows a schematic view of a processing system for processing a wafer, in accordance with some embodiments.

Referring to FIG. 1, a schematic view of a processing system 1 for processing a wafer 5 is illustrated, in accordance with some embodiments. In some embodiments, the processing system 1 includes one or more processing apparatuses, such as processing apparatuses 100 and 200, and an interface apparatus 300.

The processing apparatuses 100 and 200 are configured to perform manufacturing procedures involved in the processing of one or more wafers 5. The wafer 5 processed by the processing apparatuses 100 and 200 may include a semiconductor, conductor, and/or insulator layers. In some embodiments, the wafer 5 includes layered semiconductors. Examples include the layering of a semiconductor layer on an insulator such as that used to produce a silicon-on-insulator (SOI) wafer, a silicon-on-sapphire wafer, or a silicon-germanium-on-insulator wafer, or the layering of a semiconductor on glass to produce a thin film transistor (TFT). The wafer 5 may go through many processing steps, such as lithography, etching, and/or doping before a completed die is formed.

According to the different manufacturing procedures that the processing apparatuses 100 and 200 perform, the processing apparatuses 100 and 200 can include different features. In some embodiments, the processing apparatus 100 includes a number of process tools 110 of a first type, and the processing apparatus 200 includes a number of process tools 210 of a second type. In some embodiments, the process tools 110 are configured for coating a coating material, such as bottom anti-reflective coating (BARC) layer, over the wafer 5. The process tools 210 are configured to implement a soft bake process after the BARC layer is formed on the wafer 5. One exemplary design of the process tools 210 is described below in connection with FIG. 3.

In some embodiments, the interface apparatus 300 is located between the processing apparatus 100 and the processing apparatus 200. In some embodiments, the interface apparatus 300 is configured to move the wafer 5 out of the process tools 110 and move the wafer 5 into the process tools 210. In some embodiments, the wafer 5 is selectively transferred from the process tools 110 in the processing apparatus 100 to any of the process tools 210 in the processing apparatus 200 through the interface apparatus 300.

It is appreciated that the number of processing apparatuses and the number of interface apparatuses in the processing system 1 can be varied according to different manufacturing procedures. In addition, the processing system 1 may include baking, coating, exposure, and development processing apparatuses configured to provide a modularization of these various components to optimize throughput and efficiency of a given process.

Figure 2:
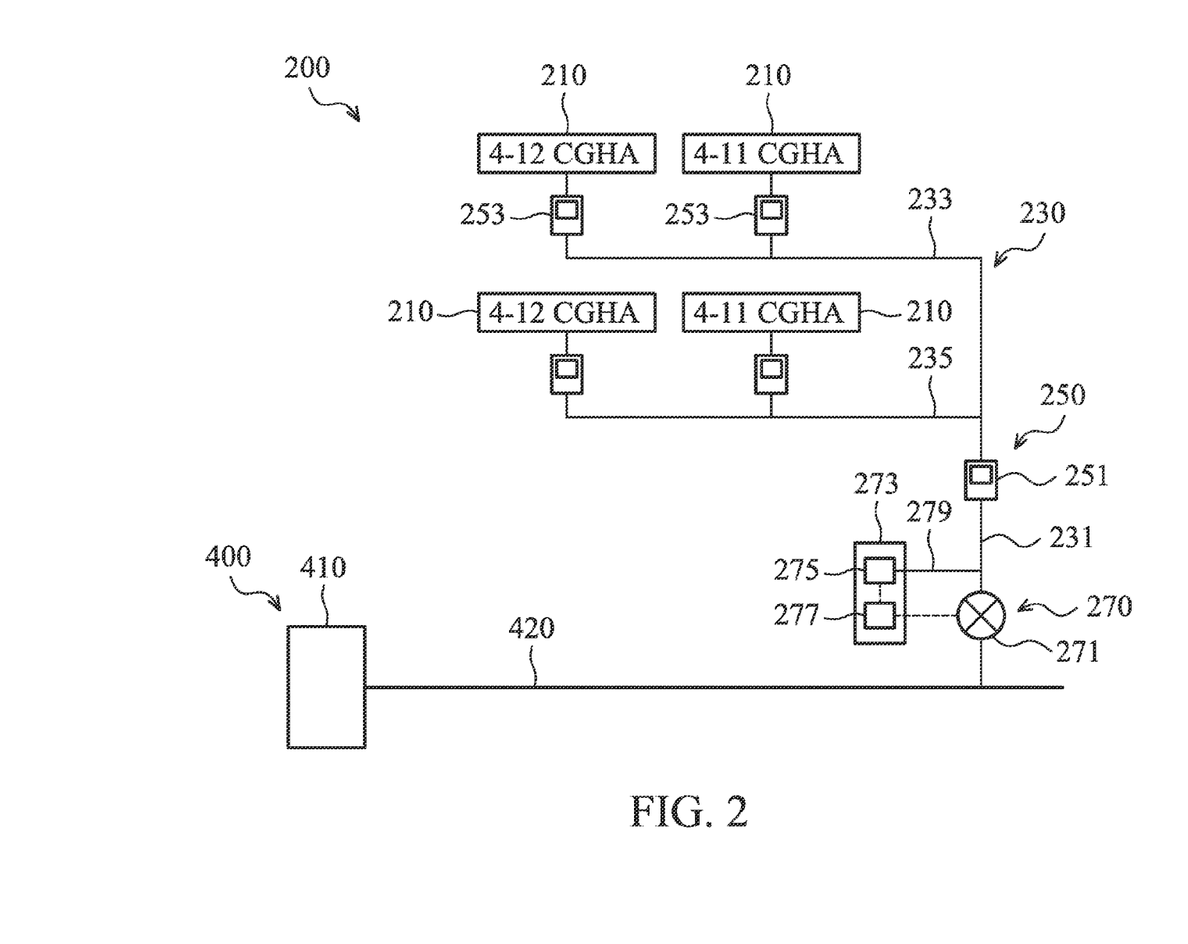
FIG. 2 shows a schematic view of a processing module, in accordance with some embodiments.

Referring to FIG. 2, a schematic view of the processing module 200 connected with a gas-handling apparatus 400 is shown, in accordance with some embodiments. The gas-handling apparatus 400 is connected to the processing apparatus 200. According to manufacturing requirements, the gas-handling apparatus 400 may contain filtering capacity as well as air movement capabilities. For example, the gas-handling apparatus 400 includes a gas-handling module 410 such as a fan, a filter assembly to clean gas, and a gas cooling assembly to cool gas.

In some embodiments, the processing apparatus 200 includes one or more processing tools 210, a fluid-conduit assembly 230, a detection assembly 250, and a flow-adjusting assembly 270. It is appreciated that the features described below can be replaced or eliminated in other embodiments of the processing apparatus 200.

The fluid-conduit assembly 230 fluidly connects the processing tools 210 to the gas-handling apparatus 400. When the gas-handling apparatus 400 is in operation, exhaust flow from the processing tools 210 is actuated and flows to the gas-handling apparatus 400 via the fluid-conduit assembly 230. In some embodiments, the fluid-conduit assembly 230 includes a main conduit 231, one or more domain conduits, such as domain conduits 233 and 235. Each of the domain conduits 233 and 235 are fluidly connected to two processing tools 210, and the main conduit 231 connects the domain conduits 233 and 235 to a passage 420 of the gas-handling apparatus 400.

The number of main conduits and the number of domain conduits can be varied according to demand. In some embodiments, the number of domain conduits corresponds to the number of processing tools. In some other embodiments, the number of domain conduits is greater or less than the number of processing tools. Some of the processing tools may connect to one or more domain conduits, and some of the processing tools may not connect to a domain conduit.

The flow-adjusting assembly 270 is connected to the fluid-conduit assembly 230 and configured to regulate the exhaust flow in the fluid-conduit assembly 230 if the exhaust pressure of the exhaust flow is outside of a predetermined specification. In some embodiments, the fluid-conduit assembly 230 includes a control valve 271, a control box 273, and a gas line 279.

The control valve 271 is disposed in the main conduit 231 of the fluid-conduit assembly 230 for adjusting the exhaust flow in the fluid-conduit assembly 230. In some embodiments, the control valve 271 is a damper including a plate rotatably disposed in the main conduit 231 of the fluid-conduit assembly 230.

The control box 273 is disposed outside of the fluid-conduit assembly 230 and configured to produce an electrical signal to control the control valve 271 according to the exhaust pressure in the fluid-conduit assembly 230. In some embodiments, the control box 273 includes a feedback sensor 275 and a controller 277. The feedback sensor 275, for example, is a differential pressure gauge with high accuracy. The feedback sensor 275 is connected to the main conduit 231 via the gas line 279 to monitor the exhaust pressure in the main conduit 231. According to the results of this monitoring, the feedback sensor 275 produces an electrical signal to the controller 277, and the controller 277 controls the operation of the control valve 271 in response to the electrical signal from the feedback sensor 275. Therefore, the exhaust flow in the fluid-conduit assembly 230 is regulated based on real-time data of exhaust pressure in the main conduit 231.

The detection assembly 250 is connected to the fluid-conduit assembly 230 and is configured to sense the exhaust flow in the fluid-conduit assembly 230. In some embodiments, the detection assembly 250 includes a number of sensors, such as sensors 251 and 253. The sensor 251 is connected to the main conduit 231 to sense the exhaust flow in the main conduit 231. The sensors 253 are respectively positioned adjacent to each of the process tools 210 and connected to the domain conduits 233 and 235. The sensors 253 are configured to sense the exhaust flow in the domain conduits 233 and 235. In some embodiments, the sensors 251 and 253 are used to sense the exhaust pressure, the temperature of the exhaust flow, the concentration of contamination particles of the exhaust flow, etc. In some embodiments, the sensors 251 and 253 are positioned inside of the fluid-conduit assembly 230. However, the position of the sensors 251 and 253 can be varied. In some embodiments, the sensors 251 and 253 are connected to the fluid-conduit assembly 230 via a fluid connecting means (not shown in FIG. 2).

Figure 3:
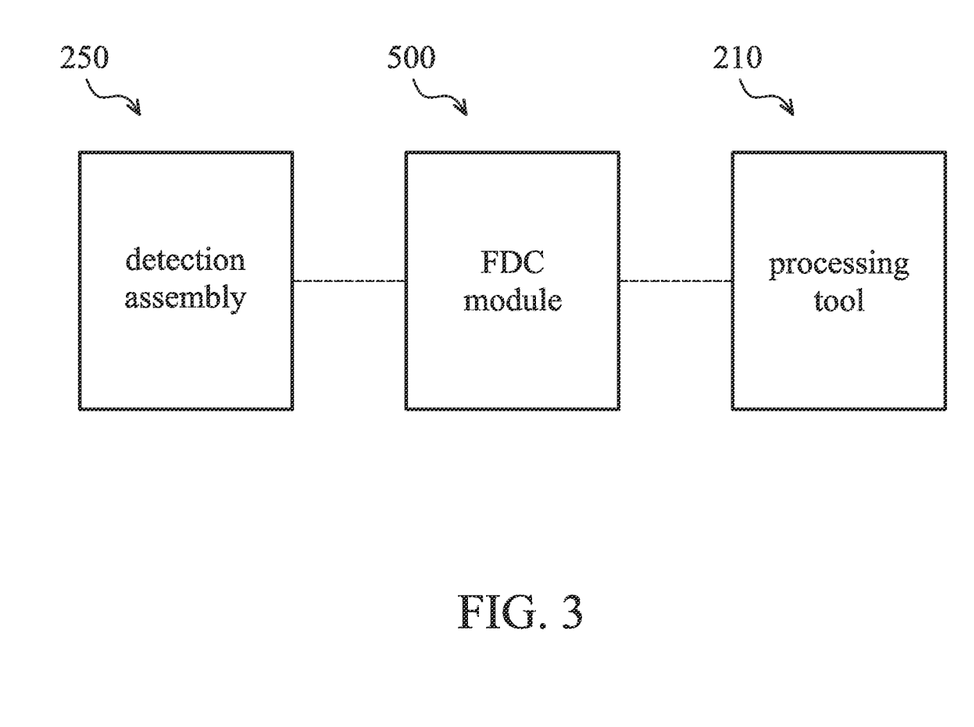
FIG. 3 shows a diagrammatic view of a portion of a processing system, in accordance with some embodiments.

Referring to FIG. 3, a diagrammatic view of a portion of the processing system 1 is shown, in accordance with some embodiments. In some embodiments, the detection result produced by the detection assembly 250 is transmitted to a fault detection and classification (FDC) module 500. The FDC module 500 may include a data processor mechanism configured to process the real-time data from the detection assembly 250. The FDC module 500 controls the processing tools 210 based on real-time data from the detection assembly 250.

Figure 4:
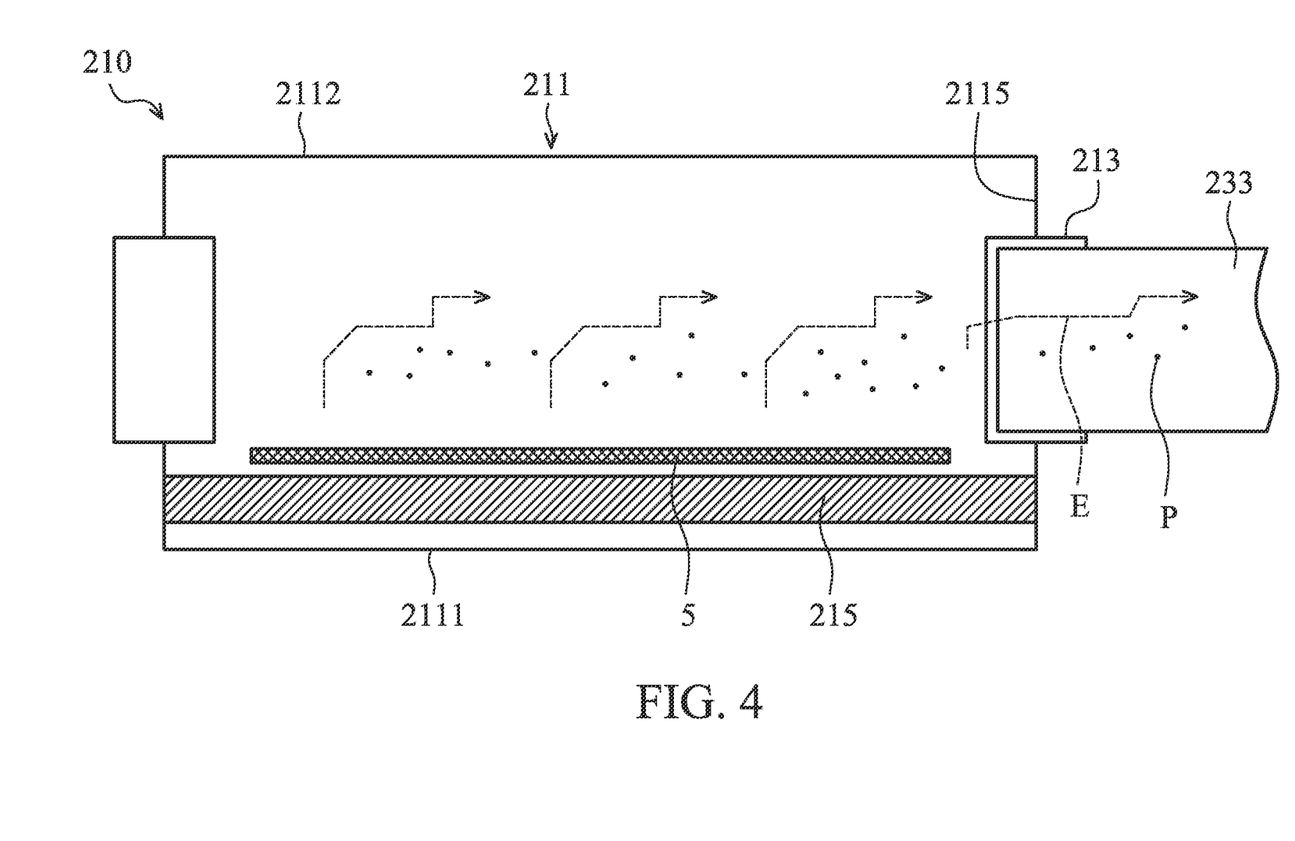
FIG. 4 shows a schematic view of a processing tool with a wafer placed inside, in accordance with some embodiments.

Referring to FIG. 4, a schematic view of the processing tool 210 with the wafer 5 placed inside is shown, in accordance with some embodiments. In some embodiments, the processing tool 210 includes a chamber 211 and a plate 215. The chamber 211 includes a lower wall 2111, an upper wall 2112, and a side wall 2115 arranged between the lower wall 2111 and the upper wall 2112. An opening 213 is formed on the side wall 2115. The processing tool 210 is connected to the domain conduit 233 via the opening 213. When the exhaust flow E is actuated, the exhaust flow E is exhausted out of the chamber 211 to the domain conduit 233. In some embodiments, the plate 215 is positioned inside of the chamber 211 for supporting the wafer 5. In some embodiments, the plate 215 is a hot plate, and the wafer 5 is able to be baked on a plate 215. The temperature of the plate 215 may be controlled by the FDC module (not shown in FIG. 4).

Figure 5:
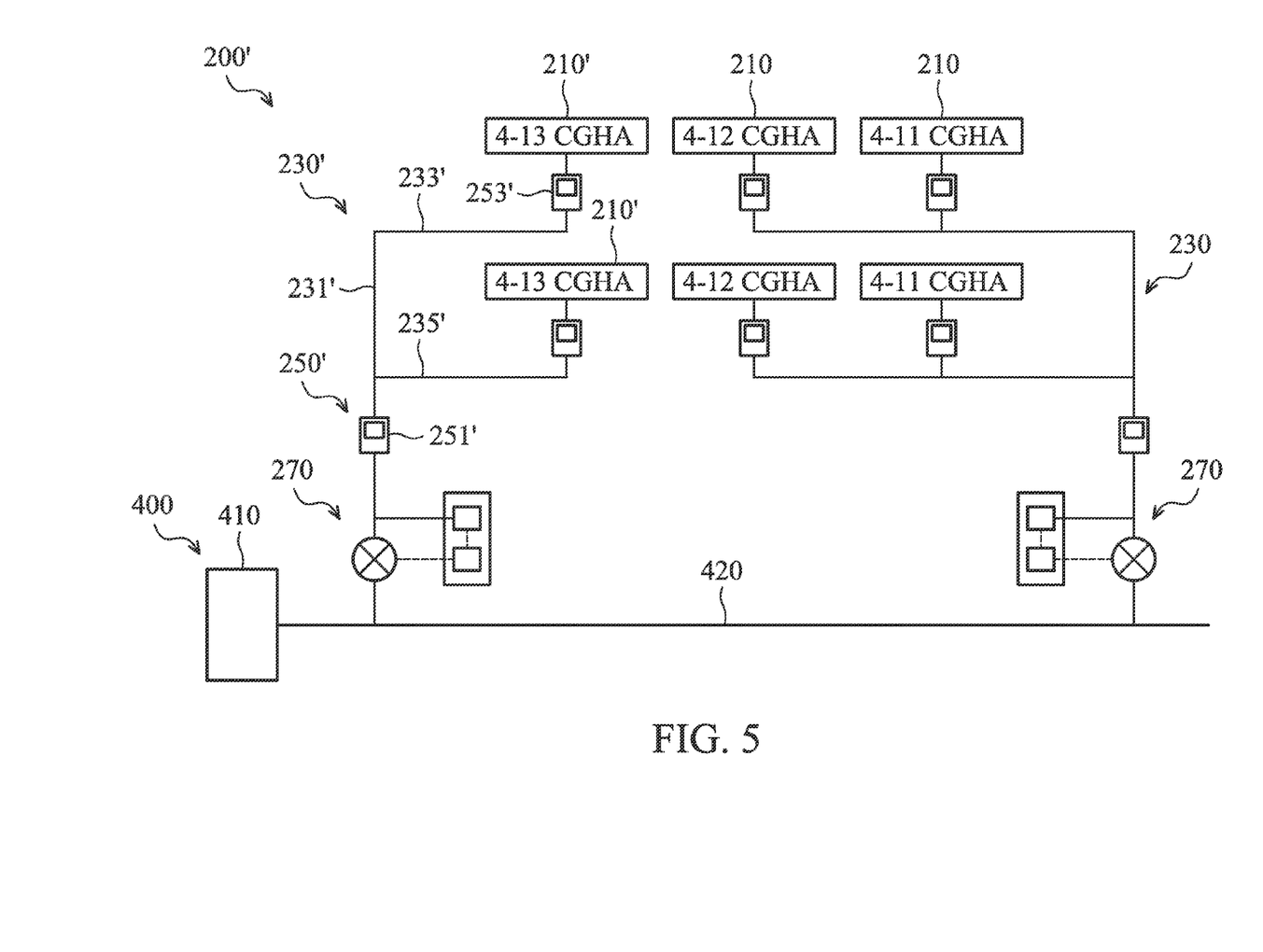
FIG. 5 shows a schematic view of a processing module, in accordance with some embodiments.

Referring to FIG. 5, a schematic view of the processing system 1' is illustrated, in accordance with some embodiments. In some embodiments, differences between the processing system 1' and the processing system 1 include the processing system 1' further including two processing tools 210', a fluid-conduit assembly 230', a detection assembly 250' and including two flow-adjusting assemblies 270.

The fluid-conduit assembly 230' fluidly connects the processing tools 210' to the gas-handling apparatus 400. When the gas-handling apparatus 400 is in operation, the exhaust flow from the processing tools 210' is actuated and flows to the gas-handling apparatus 400 via the fluid-conduit assembly 230'. In some embodiments, the fluid-conduit assembly 230 includes a main conduit 231' and one or more domain conduits, such as domain conduits 233' and 235'. Each of the domain conduits 233' and 235' is fluidly connected to one processing tool 210', and the main conduit 231' connects the domain conduits 233' and 235' to the passage 420 of the gas-handling apparatus 400.

The detection assembly 250' is connected to the fluid-conduit assembly 230' and is configured to sense the exhaust flow in the fluid-conduit assembly 230'. In some embodiments, the detection assembly 250' includes a number of sensors, such as sensors 251' and 253'. The sensor 251' is connected to the main conduit 231' to sense the exhaust flow in the main conduit 231'. The sensors 253' are respectively positioned adjacent to each process tools 210' and connected to the domain conduits 233' and 235'. The sensors 253' are configured to sense the exhaust flow in the domain conduits 233' and 235'. In some embodiments, the sensors 251' and 253' are used to sense the exhaust pressure, the temperature of the exhaust flow, the concentration of contamination particles of the exhaust flow, etc.

The flow-adjusting assembly 270 is connected to fluid-conduit assembly 230' and configured to regulate the exhaust flow in fluid-conduit assembly 230' if an exhaust pressure of the exhaust flow is outside of a predetermined specification. In some embodiments, the two flow-adjusting assemblies 270 are operated independently. According to the number of processing tools 210 and 210', the exhaust flow in the fluid-conduit assembly 230 and the fluid-conduit assembly 230' are adjusted by the two flow-adjusting assemblies 270, respectively. As a result, the amount of exhaust flow exhausted from each of the processing tools 210 and 210' is kept identical.

Figure 6:
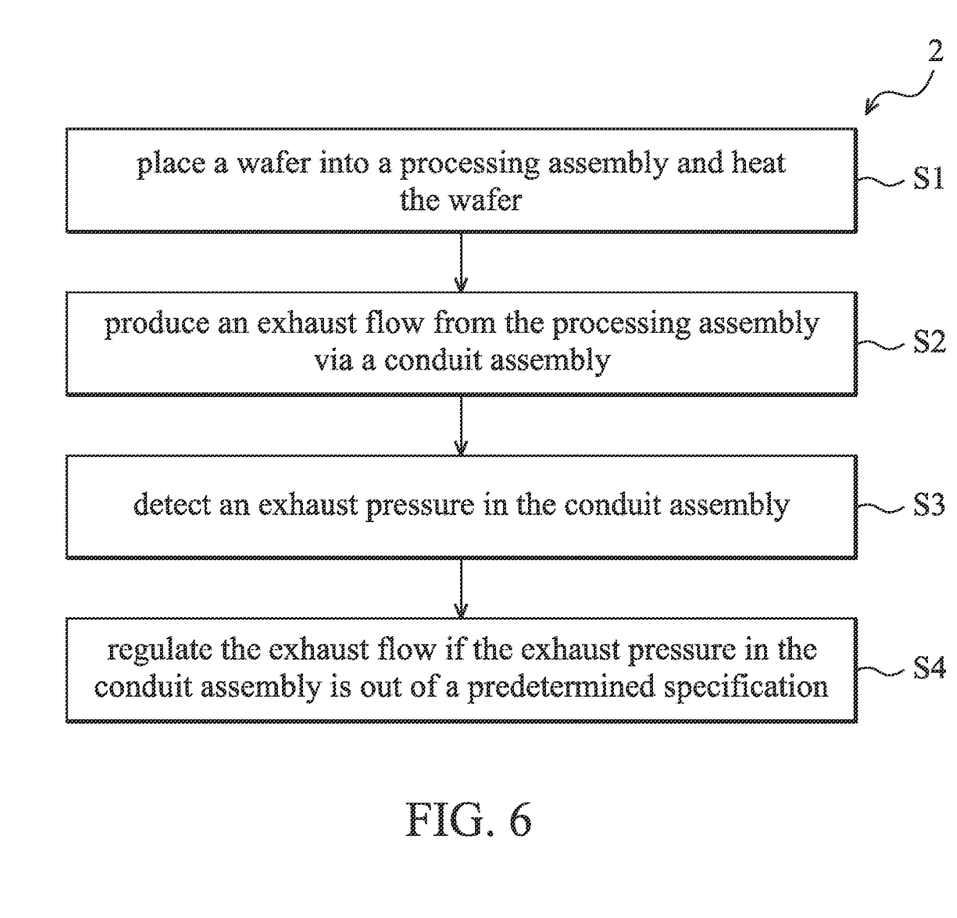
FIG. 6 shows a flow chart illustrating a method for processing a wafer, in accordance with some embodiments.

Referring to FIG. 6, a flow chart illustrating a method 2 for operating a processing system (such as processing system 1) is shown, in accordance with some embodiments. The method 2 begins with operation S1, in which the wafer 5 is placed into the processing assembly (such as the processing assembly 200) and the wafer 5 is heated in the processing assembly 200. In some embodiments, the wafer 5 is placed inside one of the process tools 210 of the processing assembly 200 by an interface assembly (such as interface apparatus 300). In some embodiments, the wafer 5 is heated to a temperature in a range from about 200° C. to about 250° C.

In some embodiments, before the wafer 5 is transferred into the processing assembly 200, a coating material is formed over the wafer 5 in another processing assembly (such as the processing assembly 100). In some embodiments, a bottom anti-reflective coating is formed over the wafer 5. The bottom anti-reflective coating provides a number of benefits, such as elimination of reflective notching generated by reflections from highly reflective substrates, reduced swing effects caused by thin film interference, and therefore improved line-width control.

The method 2 continues with operation S2, in which an exhaust flow from the processing assembly 200 is produced via a fluid-conduit assembly (such as the fluid-conduit assembly 230). In some embodiments, the exhaust flow is actuated by a gas-handling apparatus (such as the gas-handling apparatus 400) which is fluidly connected to the processing assembly 200 via the fluid-conduit assembly 230. In some embodiments, the exhaust flow is actuated when the wafer 5 is heated in the processing assembly 200. In some embodiments, the exhaust flows from the processing assembly are transmitted into the gas-handling apparatus 400 via different fluid-conduit assemblies (such as fluid-conduit assemblies 230 and 230').

In some embodiments, a vaporization of the coating materials formed over the wafer 5 occurs due to the high temperature in the processing assembly 200. Subsequent heat processing of the wafer 5 causes the vaporized coating material to become particles of powder P (FIG. 4). The particles of powder P cause contamination on the wafer surface and lower the manufacturing yield. Therefore, the exhaust flow is actuated to draw particles of powder P out of the processing assembly 200.

The method 2 continues with operation S3, in which an exhaust pressure in the fluid-conduit assembly 230 is detected. In some embodiments, the exhaust pressure is detected by a feedback sensor (such as the feedback sensor 275). After the feedback sensor 275 detects the exhaust pressure in the fluid-conduit assembly 230, a first signal is issued, and the first signal is send to a controller (such as the controller 277). In some embodiments, the exhaust pressure is detected by detection assembly (such as the detection assembly 250). After the detection assembly 250 detects the exhaust pressure in the fluid-conduit assembly 230, a second signal is issued, and the second signal is send to a control module (such as the FDC module 500).

The method 2 continues with operation S4, in which the exhaust flow in the fluid-conduit assembly 230 is regulated if the exhaust pressure in the fluid-conduit assembly 230 is outside of a predetermined specification. In some embodiments, the predetermined specification of the exhaust pressure is in a range from about 60 Pa to about 80 Pa. When the exhaust pressure in the fluid-conduit assembly 230 is below the predetermined specification, the control valve 271 is driven by the controller 277 to increase the amount of the exhaust flow in the fluid-conduit assembly 230. Therefore, the exhaust flow is always kept at the predetermined specification, even the fluid-conduit assembly 230 is blocked by the particles of powder from the processing tools 210. In some embodiments, the exhaust flow in the fluid-conduit assembly 230 is regulated in response to the first signal transmitted from the feedback sensor 277.

In some embodiments, the processing tools 210 are controlled in response to the second signal to protect the wafer 5 from damage. For example, according to the second signals transmitted from the detection assembly 250, the FDC module 500 determines if the exhaust pressure in the fluid-conduit assembly 230 is below the predetermined specification. If the exhaust pressure in the fluid-conduit assembly 230 is below the predetermined specification and is not adjusted after a period of time, the FDC module 500 triggers a command to stop the operation of the processing tools 210, so as to prevent the wafer 5 inside the processing tools 210 from being damaged. Alternatively, the FDC module 500 triggers a command to increase the flow rate of the exhaust flow in the fluid-conduit assembly 230 by the gas-handling apparatus 400.

Embodiments of the disclosure have many advantages. For example, the particles of powder are removed from the processing tools 210, decreasing the risk of contamination of the wafer 5. In addition, since the exhaust pressure in the fluid-conduit assembly 230 is monitored and controlled in real time, the exhaust pressure can be maintained stably. Since the particles of powder are continuously drawn out of the processing tools 210, the need to clean the processing tools 210 is reduced. Therefore, the throughput and the manufacturing efficiency are improved.

In accordance with some embodiments, a method for processing a wafer is provided. The method includes placing the wafer into a processing assembly and heating the wafer. The method also includes producing an exhaust flow from the processing assembly via a fluid-conduit assembly. The method further includes detecting an exhaust pressure of the exhaust flow in the fluid-conduit assembly and producing a first signal and a second signal corresponding to the exhaust pressure. In addition, the method includes regulating the exhaust flow in response to the first signal and controlling the processing assembly in response to the second signal.

In accordance with some embodiments, a method for processing a wafer is provided. The method includes forming a bottom anti-reflective coating over the wafer. The method also includes placing the wafer into the processing assembly and heating the wafer in the processing assembly. The method further includes producing an exhaust flow from the processing assembly. In addition, the method includes regulating the exhaust flow if an exhaust pressure of the exhaust flow is outside of a predetermined specification.

In accordance with some embodiments, a processing system for processing a wafer is provided. The processing system includes a processing tool and a fluid-conduit assembly. The processing tool is configured for processing the wafer. The fluid-conduit assembly is fluidly connected to the processing tool. The processing system also includes a flow-adjusting assembly. The flow-adjusting assembly includes a feedback sensor and a control valve. The feedback sensor is positioned outside of the fluid-conduit assembly. The feedback sensor is configured for detecting an exhaust pressure in the fluid-conduit assembly and producing a first signal that corresponds to the exhaust pressure. The movable control valve is positioned in the fluid-conduit assembly for adjusting an exhaust flow in the fluid-conduit assembly in response to the first signal. The processing system further includes a detection assembly. The detection assembly is configured for monitoring an exhaust pressure in the fluid-conduit assembly and producing a second signal that corresponds to the exhaust pressure. The operation of the processing tool is selectively controlled in response to the second signal.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing wafers, comprising:
heating the wafers in a first processing assembly and a second processing assembly;
producing an exhaust flow from the first processing assembly via a first domain conduit;
producing another exhaust flow from the second processing assembly via a second domain conduit;
guiding the exhaust flows from the first and second domain conduits to a main conduit;
detecting a first concentration of contamination particles of the exhaust flow in the first domain conduit and sending a first signal corresponding to the first concentration to an FDC module;
detecting a second concentration of contamination particles of the exhaust flow in the second domain conduit and producing a second signal corresponding to the second concentration;
detecting an exhaust pressure of the exhaust flow in the main conduit and producing a third signal corresponding to the exhaust pressure, wherein the first concentration and the second concentration are detected at locations upstream of a location used for detecting the exhaust pressure;
regulating the exhaust flows in response to the third signal;
controlling the first processing assembly in response to the first signal such that, if the first concentration is outside of a predetermined specification and is not adjusted after a predetermined period of time to be within the predetermined specification, operation of the first processing assembly is stopped, wherein the controlling of the first processing assembly in response to the first signal comprises changing a temperature of a plate in the first processing assembly for heating the wafer by the FDC module; and
controlling the second processing assembly in response to the second signal such that, if the second concentration is outside of a predetermined specification and is not adjusted after a predetermined period of time to be within the predetermined specification, operation of the second processing assembly is stopped.

2. The method as claimed in claim 1, further comprising regulating the exhaust flows by increasing the amount of the exhaust flows or increasing the flow rate of the exhaust flows.

3. The method as claimed in claim 2, further comprising transmitting the third signal to a controller and controlling a control valve in the main conduit by the controller to adjust the amount of the exhaust flows.

4. The method as claimed in claim 1, wherein the wafers are heated in the processing assembly to a temperature in a range from about 200° C. to about 250° C.

5. The method as claimed in claim 1, wherein before the wafers are heated, a bottom anti-reflective coating is formed over the wafer.

6. The method as claimed in claim 1, further comprising regulating the exhaust flow in response to the first signal, wherein the first signal is transmitted to a gas-handling apparatus which actuates the exhaust flow from the first processing assembly via the domain conduit and the main conduit, and the flow rate of the exhaust flow is adjusted by the gas-handling apparatus in response to the first signal.

7. A method for processing wafers, comprising:
forming a bottom anti-reflective coating over the wafers;
placing the wafers into two processing assemblies and heating the wafers in the two processing assemblies;
producing an exhaust flow from the two processing assemblies via two domain conduits;
guiding the exhaust flows from the two domain conduits to a main conduit;
regulating the exhaust flow if an exhaust pressure of the exhaust flow in the main conduit is outside of a predetermined specification;

monitoring a concentration of contamination particles of the exhaust flow in the two domain conduits that are at two locations upstream of a location used for performing the regulating;

stopping heating the wafer in one of the two processing assemblies if the monitoring indicated that the concentration of contamination particles of the exhaust flow in the corresponding domain conduit is outside of the predetermined specification for a predetermined period of time;

regulating the exhaust flow in accordance with an electrical signal that corresponds to the exhaust pressure of the exhaust flow; and regulating the exhaust flow by a gas-handling apparatus in response to electrical signals corresponding to the concentration of contamination particles of the exhaust flow in the two domain conduits, wherein the gas-handling apparatus actuates the exhaust flow from the processing assemblies via the two domain conduit and the main conduit.

8. The method as claimed in claim 7, further comprising regulating the exhaust flow by adjusting the amount of the exhaust flow or adjusting the flow rate of the exhaust flow.

9. The method as claimed in claim 7, further comprising regulating the exhaust flow in each domain conduit independently.

10. The method as claimed in claim 7, wherein the wafers are heated in the two processing assemblies to a temperature in a range from about 200° C. to about 250° C.

11. The method as claimed in claim 7, wherein the electrical signal corresponding to the exhaust pressure of the exhaust flow is issued by a feedback sensor configured to detect the exhaust pressure in the main conduit which is connected to two processing assemblies.

12. The method as claimed in claim 7, wherein the electrical signal corresponding to the exhaust pressure of the exhaust flow is issued by sensors configured to detect the exhaust pressure in the domain conduits which are immediately connected to two processing assemblies.

13. The method as claimed in claim 7, further comprising:

sending electrical signals corresponding to the concentration of contamination particles of the exhaust flow in the two domain conduits to an FDC module; and controlling a temperature of a plate in one of the processing assemblies for heating the wafer by the FDC module in response to the electrical signals corresponding to concentration of contamination particles of the exhaust flow from the corresponding domain conduit.

* * * * *